(12) United States Patent
Nakashima

(10) Patent No.: US 10,873,268 B2
(45) Date of Patent: Dec. 22, 2020

(54) MAIN CIRCUIT WIRING MEMBER AND POWER CONVERSION DEVICE

(71) Applicant: Mitsubishi Electric Corporation, Tokyo (JP)

(72) Inventor: Yukio Nakashima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/474,285

(22) PCT Filed: Mar. 2, 2017

(86) PCT No.: PCT/JP2017/008368
§ 371 (c)(1),
(2) Date: Jun. 27, 2019

(87) PCT Pub. No.: WO2018/158922
PCT Pub. Date: Sep. 7, 2018

(65) Prior Publication Data
US 2019/0379295 A1   Dec. 12, 2019

(51) Int. Cl.
*H02M 7/02* (2006.01)
*H02M 7/00* (2006.01)
(Continued)

(52) U.S. Cl.
CPC ............ *H02M 7/003* (2013.01); *H02G 5/005* (2013.01); *H02M 1/32* (2013.01); *H02M 7/5387* (2013.01); *H05K 7/02* (2013.01)

(58) Field of Classification Search
CPC .......... H02M 7/48; H02M 7/003; H02M 1/32; H02M 7/5387; H02G 5/005; H05K 7/04
(Continued)

(56) References Cited

U.S. PATENT DOCUMENTS

| | | | | |
|---|---|---|---|---|
| 2,932,810 A | * | 4/1960 | Novak | H01H 63/06 439/61 |
| 2002/0034087 A1 | * | 3/2002 | Suzuki | H02M 7/003 363/144 |

(Continued)

FOREIGN PATENT DOCUMENTS

| | | | | |
|---|---|---|---|---|
| JP | 2007-312566 A | * | 11/2007 | ............. H02M 7/48 |
| JP | 2007312566 A | | 11/2007 | |

(Continued)

OTHER PUBLICATIONS

International Search Report (PCT/ISA/210) with translation, and Written Opinion (PCT/ISA/237) dated Apr. 4, 2017, by the Japan Patent Office as the International Searching Authority for International Application No. PCT/JP2017/008368.

(Continued)

*Primary Examiner* — William H. Mayo, III
(74) *Attorney, Agent, or Firm* — Buchanan Ingersoll & Rooney PC

(57) ABSTRACT

A main circuit wiring member for electrically connecting a supply source of direct-current power and a semiconductor element module to each other or semiconductor element modules to each other, includes a first conductor covered with an insulating film and configured to allow a first potential to be applied thereto, a second conductor covered with the insulating film and configured to allow a second potential to be applied thereto, the second potential being lower than the first potential, and an insulating member that has intermediate-potential layer conductors sandwiched therein and is arranged between the first conductor and the second conductor.

13 Claims, 7 Drawing Sheets

(51) Int. Cl.
*H02G 5/00* (2006.01)
*H02M 1/32* (2007.01)
*H02M 7/5387* (2007.01)
*H05K 7/02* (2006.01)

(58) Field of Classification Search
USPC .................. 174/116, 117 R, 117 F, 117 FF
See application file for complete search history.

(56) References Cited

U.S. PATENT DOCUMENTS

| | | | | |
|---|---|---|---|---|
| 2002/0047627 | A1* | 4/2002 | Pickering | H02J 9/065 |
| | | | | 315/291 |
| 2010/0033165 | A1* | 2/2010 | Rostamzadeh | G01R 31/001 |
| | | | | 324/127 |
| 2010/0085106 | A1* | 4/2010 | Schreiber | H02M 7/219 |
| | | | | 327/434 |
| 2010/0327654 | A1* | 12/2010 | Azuma | B60L 50/11 |
| | | | | 307/9.1 |
| 2011/0308834 | A1* | 12/2011 | Takahashi | H02M 7/003 |
| | | | | 174/68.2 |
| 2013/0322141 | A1 | 12/2013 | Kobayashi et al. | |
| 2015/0289391 | A1* | 10/2015 | Nakatsu | H05K 5/0026 |
| | | | | 361/796 |
| 2016/0373017 | A1* | 12/2016 | Mima | H02J 9/06 |
| 2017/0179842 | A1* | 6/2017 | Tanaka | B60L 1/00 |

FOREIGN PATENT DOCUMENTS

| | | |
|---|---|---|
| JP | 2009-022062 A | 1/2009 |
| WO | 2012108048 A1 | 8/2012 |

OTHER PUBLICATIONS

Action dated Jul. 10, 2020, by the India Patent Office in corresponding India Patent Application No. 201947032169 and English translation of the Office Action. (6 pages).

* cited by examiner

MAIN CIRCUIT WIRING MEMBER AND POWER CONVERSION DEVICE

FIELD

The present invention relates to a main circuit wiring member for electrically connecting a semiconductor element module and a filter capacitor to each other or semiconductor element modules to each other, and a power conversion device that uses the main circuit wiring member.

BACKGROUND

Patent Literature 1 listed below discloses a power conversion device having a configuration in which a semiconductor element module and a filter capacitor are electrically connected to each other by a busbar.

CITATION LIST

Patent Literature

Patent Literature 1: International Publication No. WO2012/108048

SUMMARY

Technical Problem

In order to ensure a breakdown voltage in the above conventional technique, it is not possible to make the thickness of the busbar too thin. Therefore, the thickness of an insulating layer for insulating a pair of conductors becomes a bottleneck in the conventional technique, which prevents downsizing of the busbar that is a main circuit wiring member.

The present invention has been achieved in view of the above problem, and an object of the present invention is to provide a main circuit wiring member that realizes further downsizing while ensuring a required breakdown voltage.

Solution to Problem

In order to solve the above problem and achieve the object, the present invention provides a main circuit wiring member for electrically connecting a supply source of direct-current power and a semiconductor element module to each other or semiconductor element modules to each other. The main circuit wiring member according to the preset invention includes: a first conductor covered with a conductor-insulating member and configured to allow a first potential to be applied thereto; a second conductor covered with a conductor-insulating member and configured to allow a second potential to be applied thereto, the second potential being lower than the first potential; and a conductor-to-conductor insulating member having one or a plurality of intermediate-potential layer conductors sandwiched therein, and arranged between the first conductor and the second conductor.

Advantageous Effects of Invention

According to the present invention, there is an effect where it is possible to realize further downsizing while ensuring a required breakdown voltage in a main circuit wiring member.

DESCRIPTION OF EMBODIMENTS

A main circuit wiring member and a power conversion device according to embodiments of the present invention will be described in detail below with reference to the accompanying drawings. The present invention is not limited to the embodiments. In the following descriptions, "physical connection" and "electrical connection" are not distinguished from each other and are simply described as "connection" unless otherwise intentionally specified.

First Embodiment

Figure 1:
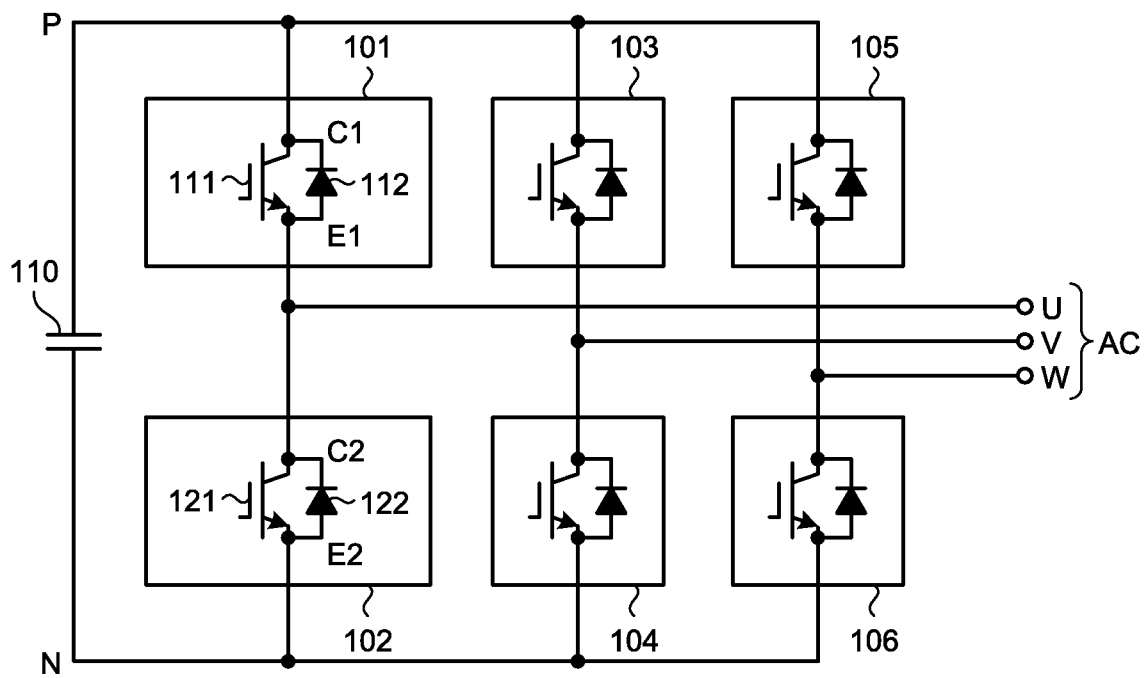
FIG. 1 is a diagram illustrating a configuration example of a main circuit of a power conversion device according to a first embodiment.

FIG. 1 is a diagram illustrating a configuration example of a main circuit of a power conversion device according to a first embodiment. FIG. 1 illustrates a case where the main circuit of the power conversion device is a two-level three-phase inverter as an example. The main circuit that is a two-level three-phase inverter includes a filter capacitor 110 that is a supply source of direct-current power and semiconductor element modules 101 to 106 connected between a positive terminal P and a negative terminal N of the filter capacitor 110, as illustrated in FIG. 1.

The semiconductor element module 101 forming a positive arm and the semiconductor element module 102 forming a negative arm are connected in series to each other between the positive terminal P and the negative terminal N of the filter capacitor 110. A connection point between the semiconductor element modules 101 and 102 is led out to form a U-phase alternating-current terminal that is an alternate-current (AC) terminal. Similarly, between the positive terminal P and the negative terminal N of the filter capacitor 110, which are direct-current terminals, the semiconductor element module 103 forming a positive arm and the semiconductor element module 104 forming a negative arm are connected in series to each other, and the semiconductor element module 105 forming a positive arm and the semiconductor element module 106 forming a negative arm are connected in series to each other. A connection point between the semiconductor element modules 103 and 104 is led out to form a V-phase alternating-current terminal, and a connection point between the semiconductor element modules 105 and 106 is led out to form a W-phase alternating-current terminal. These semiconductor element modules 101 to 106 perform a switching operation that converts direct-current power accumulated in the filter capacitor 110 to alternating-current power.

The semiconductor element module 101 is configured to include an IGBT 111 that is an example of a switching element and a diode 112 connected to the IGBT 111 in anti-parallel connection. A collector of the IGBT 111 and a cathode of the diode 112 are connected to each other to form a terminal C1, and an emitter of the IGBT 111 and an anode of the diode 112 are connected to each other to form a terminal E1. The semiconductor element module 102 is configured to include an IGBT 121 and a diode 122 connected to the IGBT 121 in anti-parallel connection. A collector of the IGBT 121 and a cathode of the diode 122 are connected to each other to form a terminal C2, and an emitter of the IGBT 121 and an anode of the diode 122 are connected to each other to form a terminal E2.

Although FIG. 1 illustrates an example in which each of the positive arm and the negative arm is configured by one semiconductor element module, the main circuit may be configured by using a so-called 2-in-1 module in which the positive arm and the negative arm are accommodated in one package. In a case of using a 2-in-1 module, the main circuit can be configured by using three 2-in-1 modules.

In addition, although FIG. 1 illustrates a main circuit that is a two-level three-phase inverter as an example, the present invention may be applied to a main circuit having a single-phase configuration or a half-bridge configuration in place of a three-phase configuration. Further, the present invention may be applied to a converter that converts alternating-current power to direct-current power in place of an inverter. Furthermore, the present invention may be applied to a three-level main circuit in place of a two-level main circuit.

Figure 2:
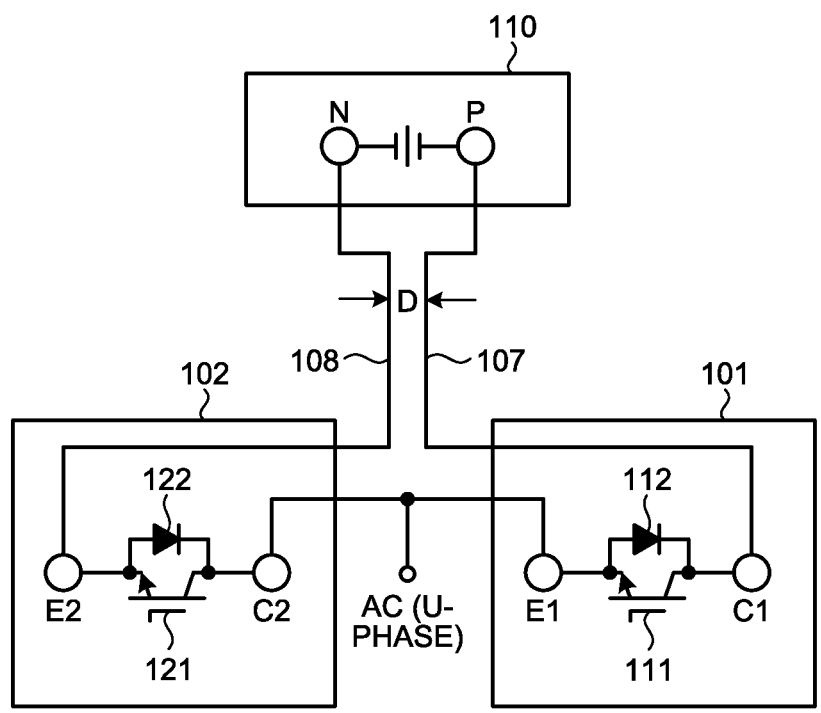
FIG. 2 is a diagram illustrating a connection mode between a switching element and a direct-current terminal on a filter capacitor, which configure the main circuit of the power conversion device according to the first embodiment.

FIG. 2 is a diagram illustrating a connection mode between a switching element and a direct-current terminal on a filter capacitor, which configure the main circuit of the power conversion device according to the first embodiment. While FIG. 1 is a normal circuit diagram, FIG. 2 is a connection diagram that illustrates an arrangement close to an actual arrangement. In FIG. 2, portions identical to those illustrated in FIG. 1 are denoted by like reference signs and illustrated.

In FIG. 2, a connecting conductor 107 for connecting the positive terminal P of the filter capacitor 110 and the terminal C1 of the semiconductor element module 101 to each other and a connecting conductor 108 for connecting the negative terminal N of the filter capacitor 110 and the terminal E2 of the semiconductor element module 102 to each other are provided between the filter capacitor 110 and the semiconductor element modules 101 and 102.

The connecting conductors 107 and 108 are arranged in parallel to and close to each other. A current supplied from the filter capacitor 110 flows through the connecting conductors 107 and 108 in opposite directions to each other. That is, the connecting conductors 107 and 108 form reciprocating paths. When the connecting conductors 107 and 108 form reciprocating paths, directions of magnetic fields generated by opposite currents flowing through the reciprocating paths are also opposite to each other. Therefore, actions of the magnetic fields between the connecting conductors 107 and 108 are canceled out by the magnetic fields in the opposite directions to each other, so that an inductance component between the filter capacitor 110 and the semiconductor element module 101 becomes small. Further, when the connecting conductors 107 and 108 are formed by parallel flat conductors, an interaction between the magnetic fields becomes small.

Therefore, by configuring the connecting conductors 107 and 108 by parallel flat conductors and minimizing a distance D between these conductors, it is possible to largely reduce the inductance component between the filter capacitor 110 and the semiconductor element module 101. The device configured by using this operation principle is a laminated busbar described later.

Although FIG. 2 illustrates a connection mode between a switching element and a direct-current terminal on a filter capacitor, which configure a main circuit of a power conversion device, it is needless to say that the connecting conductors 107 and 108 may be also used for connecting switching elements that configure the main circuit of the power conversion device to each other.

Figure 3:
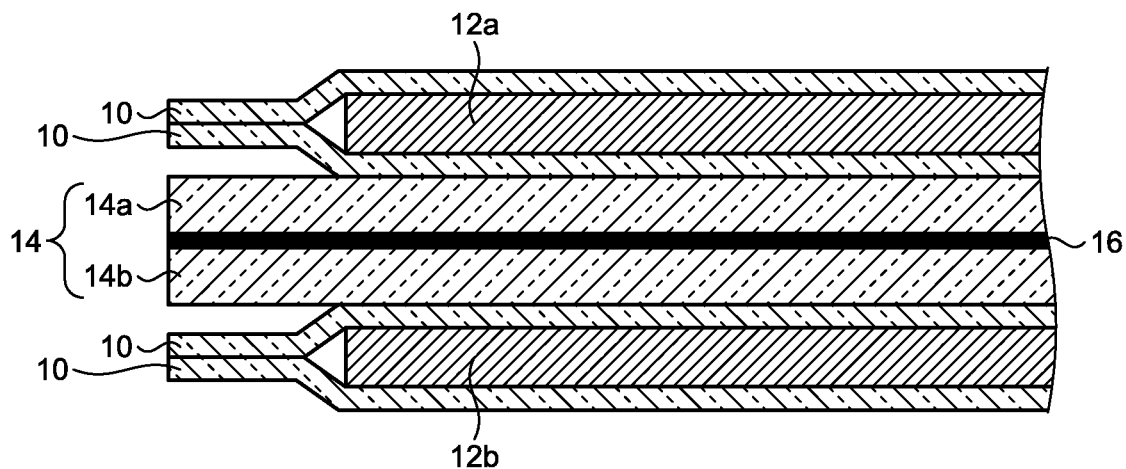
FIG. 3 is a cross-sectional view schematically illustrating a configuration of a main circuit wiring member according to the first embodiment.

FIG. 3 is a cross-sectional view schematically illustrating a configuration of a main circuit wiring member according to the first embodiment. FIG. 3 illustrates a cross-sectional configuration of the main circuit wiring member according to the first embodiment.

In FIG. 3, the main circuit wiring member includes a conductor 12a and a conductor 12b. The conductor 12a is a first conductor connected to a positive terminal of a supply source of direct-current power (not illustrated in FIG. 3). The conductor 12b is a second conductor connected to a negative terminal of the supply source of direct-current power. Each of the conductors 12a and 12b is formed as a flat plate. That is, so-called parallel flat conductors are configured by the conductors 12a and 12b. The conductor 12a corresponds to the connecting conductor 107 illustrated in FIG. 2, and the conductor 12b corresponds to the connecting conductor 108 illustrated in FIG. 2.

Each of the conductors 12a and 12b is covered with an insulating film 10 that is a conductor-insulating member. In a case of connecting the conductor 12a covered with the insulating film 10 to the positive terminal of the supply source of direct-current power, it suffices that a portion of the insulating film 10 is removed to expose a conductor portion and electrical connection is established between the exposed conductor portion and the positive terminal of the supply source of direct-current power. It is also allowable that the conductor 12a is not directly connected to the positive terminal of the supply source of direct-current power, but has any configuration as long as the configuration allows application of a first potential provided by the positive terminal of the supply source of direct-current power to the conductor 12a. The same description is applied to the conductor 12b covered with the insulating film 10, and the connection configuration of the conductor 12b may be any configuration as long as the configuration allows application of a second potential, lower than the first potential, provided by the negative terminal of the supply source of direct-current power to the conductor 12b.

An insulating member 14 is arranged between the conductor 12a covered with the insulating film 10 and the conductor 12b covered with the insulating film 10. The insulating member 14 is a conductor-to-conductor insulating member formed with an intermediate-potential layer conductor 16 sandwiched therein. The insulating member 14 is used for enhancing insulation between a potential applied to the conductor 12a and a potential applied to the conductor 12b. In the following description, a portion arranged on the side of the conductor 12a is called a first insulating member 14a and a portion arranged on the side of the conductor 12b is called a second insulating member 14b for the sake of convenience.

An example of the conductors 12a and 12b is copper or aluminum. An example of the insulating member 14 is silicon-based rubber. An example of the intermediate-potential layer conductor 16 is carbon paper. Any of these materials is an example and these constituent elements are not limited to the materials.

Figure 4:
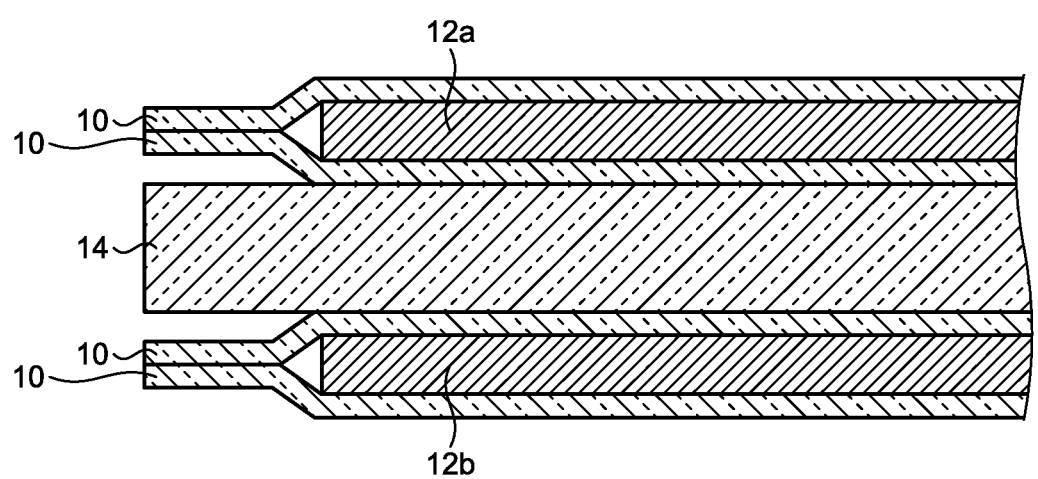
FIG. 4 is a cross-sectional view schematically illustrating a configuration of a general main circuit wiring member.

FIG. 4 is a cross-sectional view schematically illustrating a configuration of a general main circuit wiring member. As is apparent from the comparison between FIGS. 3 and 4, the main circuit wiring member according to the first embodiment is different from the general main circuit wiring member that has been conventionally used in that the intermediate-potential layer conductor 16 is inserted in the insulating member 14.

Figure 5:
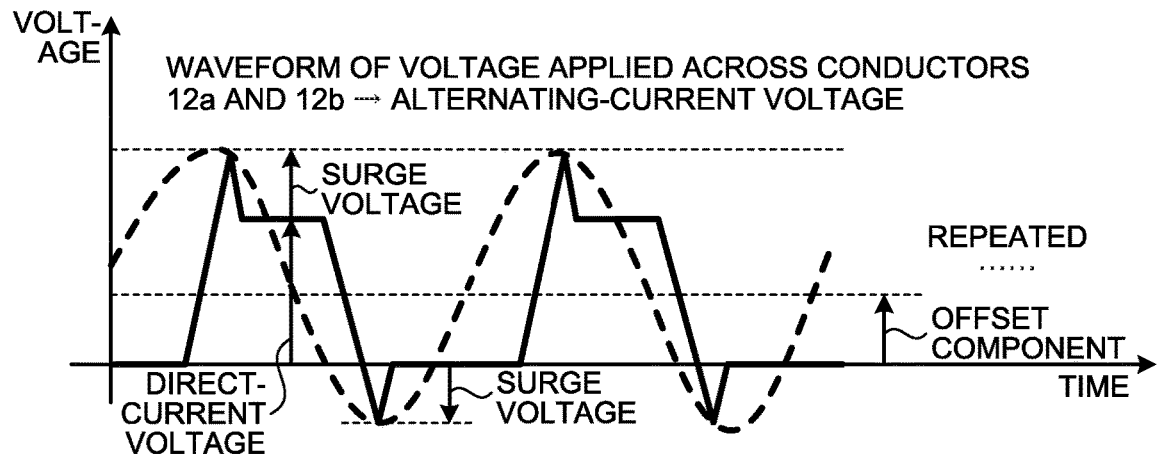
FIG. 5 is a diagram illustrating a first example of a voltage waveform when a direct-current voltage is applied to the main circuit wiring member having the configuration illustrated in FIG. 4.

FIG. 5 is a diagram illustrating a first example of a voltage waveform when a direct-current voltage is applied to the main circuit wiring member having the configuration illustrated in FIG. 4. In FIG. 5, a thick solid line denotes a waveform of a voltage generated between the conductors 12a and 12b, and a thick broken line denotes a waveform of a voltage equivalently applied across the conductors 12a and 12b.

When a switching element that configures a main circuit performs a switching operation, a surge voltage illustrated in FIG. 5 is generated at the start of the switching operation. This surge voltage is superimposed on a direct-current voltage that is an output voltage of a supply source of direct-current power. This surge voltage is also generated at the end of the switching operation. Further, the surge voltage generated at the end of the switching operation is a negative voltage. Therefore, the voltage applied across the conductors 12a and 12b is an equivalent alternating-current voltage that has an offset component and changes back and forth between a positive potential and a negative potential.

Figure 6:
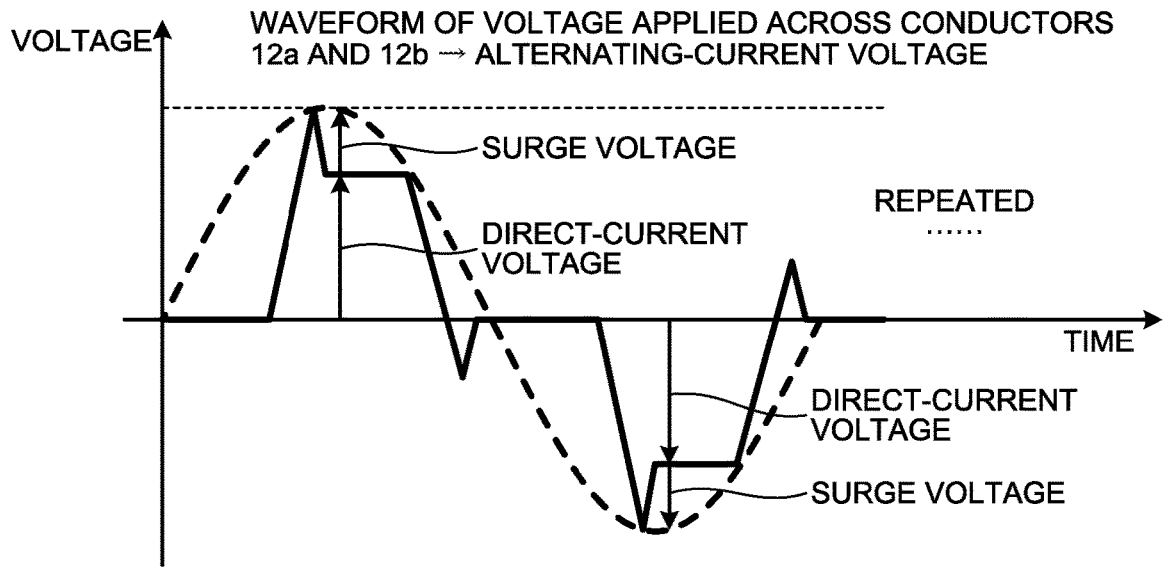
FIG. 6 is a diagram illustrating a second example of a voltage waveform when a direct-current voltage is applied to the main circuit wiring member having the configuration illustrated in FIG. 4.

FIG. 6 is a diagram illustrating a second example of a voltage waveform when a direct-current voltage is applied to the main circuit wiring member having the configuration illustrated in FIG. 4. The second example illustrated in FIG. 6 is different from the first example in a driving signal for driving a switching element.

In FIG. 6, similarly to FIG. 5, a thick solid line denotes a waveform of a voltage generated between the conductors 12a and 12b, and a thick broken line denotes a waveform of a voltage equivalently applied across the conductors 12a and 12b. In the second example illustrated in FIG. 6, a surge voltage is generated in a positive direction and a negative direction symmetrically. Therefore, the voltage applied across the conductors 12a and 12b is an equivalent alternating-current voltage that has no offset component.

It has been described that the insulating member 14 is provided for enhancing insulation between the conductors 12a and 12b. It is known that if insulation is insufficient, insulation between the conductors 12a and 12b is broken, causing partial discharge. Although insulation is enhanced by increasing the thickness of the insulating member 14, this increase causes increase of the thickness of a main circuit wiring member, resulting in increase of the size of the main circuit wiring member. On the other hand, the main circuit wiring member according to the first embodiment focuses on enhancement of insulation between the conductors 12a and 12b without changing the thickness of the insulating member 14.

Figure 7:
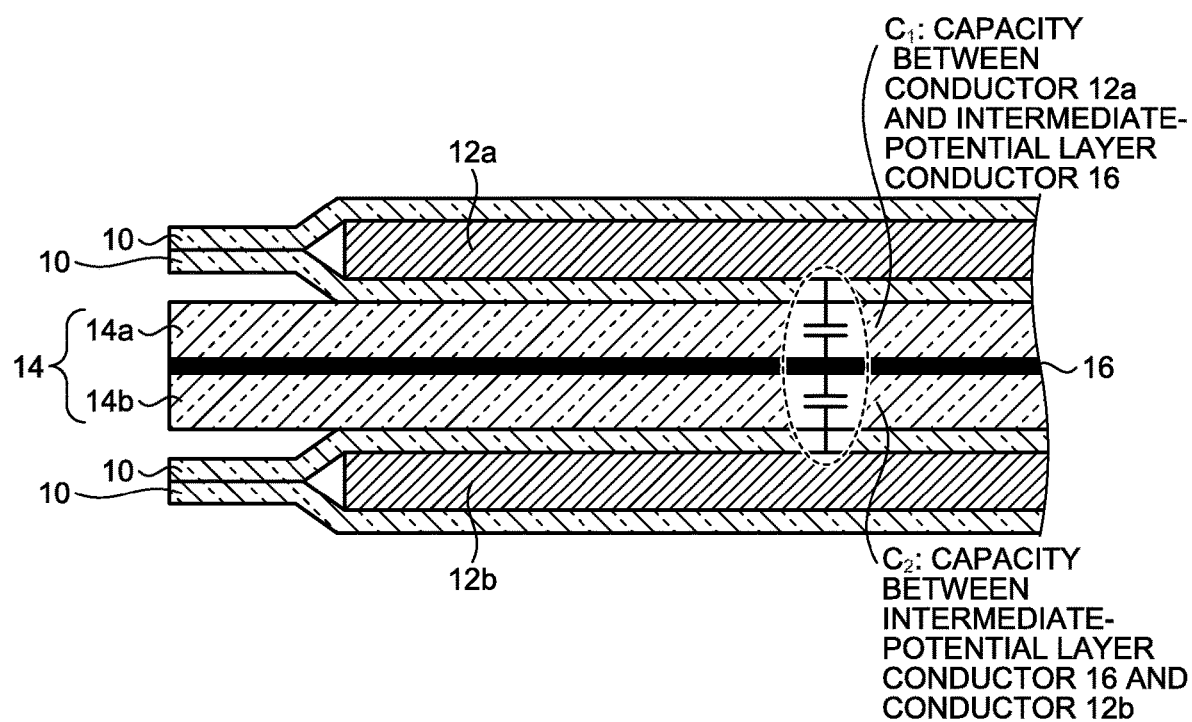
FIG. 7 is a first diagram for explaining an operation and an advantageous effect of the main circuit wiring member according to the first embodiment.

FIG. 7 is a first diagram for explaining an operation and an advantageous effect of the main circuit wiring member according to the first embodiment. FIG. 7 illustrates capacitances $C_1$ and $C_2$ that can be generated in the insulating member 14 of the main circuit wiring member according to the first embodiment illustrated in FIG. 3.

The intermediate-potential layer conductor 16 is not connected to either of the conductors 12a and 12b. Therefore, a potential of the intermediate-potential layer conductor 16 is a floating potential that is determined by a potential of the conductor 12a and a potential of the conductor 12b. Assuming that a capacitance between the conductor 12a and the intermediate-potential layer conductor 16 is $C_1$ and a capacitance between the intermediate-potential layer conductor 16 and the conductor 12b is $C_2$ as illustrated in FIG. 7, the potential of the intermediate-potential layer conductor 16 is a potential obtained by proportionately dividing a potential difference between the conductors 12a and 12b by a division ratio of $C_1$ and $C_2$. If the thickness of the insulating film 10 is uniform and the thickness of the first insulating member 14a and the thickness of the second insulating member 14b are equal to each other, the values of the capacitances $C_1$ and $C_2$ are equal to each other and the potential of the intermediate-potential layer conductor 16 is ½ of a potential difference between the conductors 12a and 12b.

Figure 8:
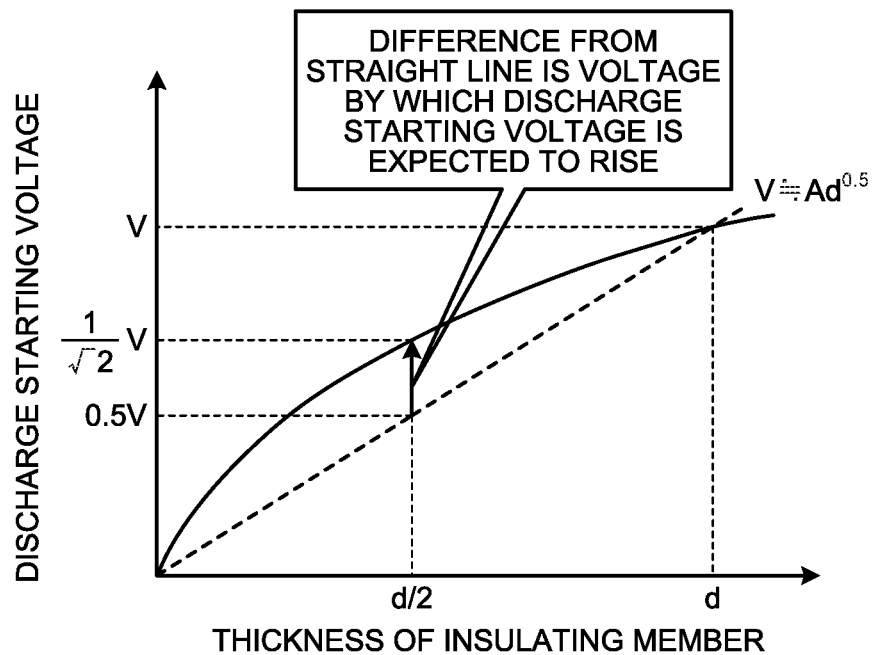
FIG. 8 is a second diagram for explaining an operation and an advantageous effect of the main circuit wiring member according to the first embodiment.

FIG. 8 is a second diagram for explaining an operation and an advantageous effect of the main circuit wiring member according to the first embodiment. In FIG. 8, the horizontal axis represents the thickness of an insulating member, and the vertical axis represents a discharge starting voltage that is a starting voltage of partial discharge.

In general, a discharge starting voltage tends to be saturated with increase of the thickness of an insulating member, as illustrated in FIG. 8. Specifically, it is said that the discharge starting voltage is approximately proportional to the power of 0.5 of the thickness of the insulating member. That is, a discharge starting voltage V and a thickness d of an insulating member have a relation represented by the following expression (1) therebetween.

$$V \approx Ad^{0.5} \quad (1)$$

"A" in the above expression (1) is a coefficient determined by the material of the insulating member.

The above expression (1) means that even when the thickness d of the insulating member is doubled, the discharge starting voltage V is not doubled but is less than twice its original magnitude. To the contrary, it means that when the thickness d of the insulating member is reduced to ½, the discharge starting voltage V is larger than ½. Specifically, when the thickness d of the insulating member is reduced to ½, the discharge starting voltage V is $1/\sqrt{2}$ times (≈0.7 times). A broken line in FIG. 8 denotes a waveform when it is assumed that the thickness d of the insulating member and the discharge starting voltage V are proportional to each other. Therefore, a difference represented by the length of an arrow in FIG. 8 is a voltage by which the discharge starting voltage V is expected to rise.

Figure 9:
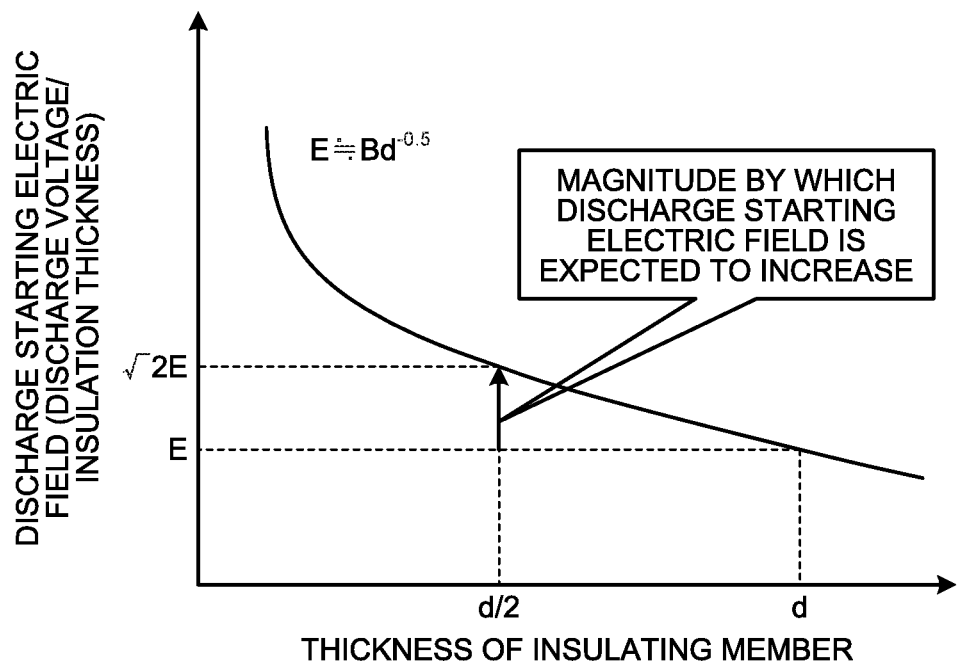
FIG. 9 is a third diagram for explaining an operation and an advantageous effect of the main circuit wiring member according to the first embodiment.

FIG. 9 is a third diagram for explaining an operation and an advantageous effect of the main circuit wiring member according to the first embodiment. In FIG. 9, the horizontal axis represents the thickness of an insulating member, and the vertical axis represents a discharge starting electric field that is an electric field at the start of partial discharge.

As represented on the vertical axis in FIG. 9, a discharge starting electric field E can be obtained by dividing the discharge starting voltage V by the thickness d of the insulating member. Therefore, the discharge starting electric field E and the thickness d of the insulating member have a relation represented by the following expression (2) therebetween.

$$E \approx Bd^{-0.5} \qquad (2)$$

"B" in the above expression (2) is a coefficient determined by the material of the insulating member.

It is shown in FIG. 9 that the discharge starting electric field E can be $\sqrt{2}$ times by reducing the thickness d of the insulating member to ½. A difference represented by the length of an arrow in FIG. 9 is the magnitude of an electric field by which the discharge starting electric field E is expected to increase.

Figure 10:
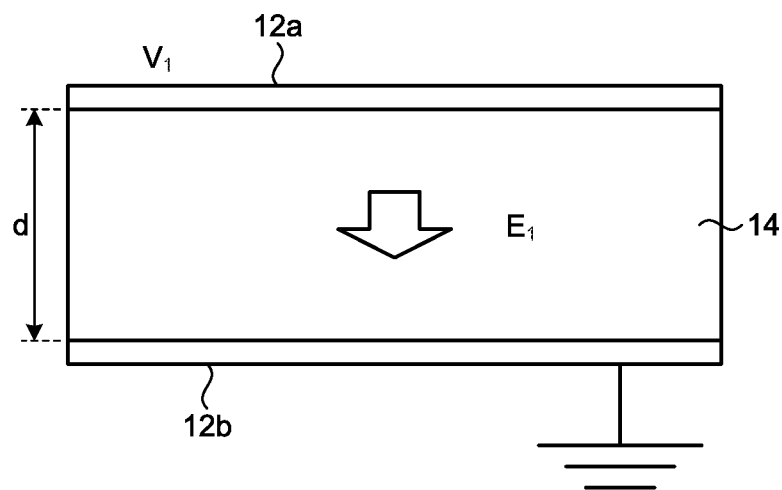
FIG. 10 is a fourth diagram for explaining an operation and an advantageous effect of the main circuit wiring member according to the first embodiment.
Figure 11:
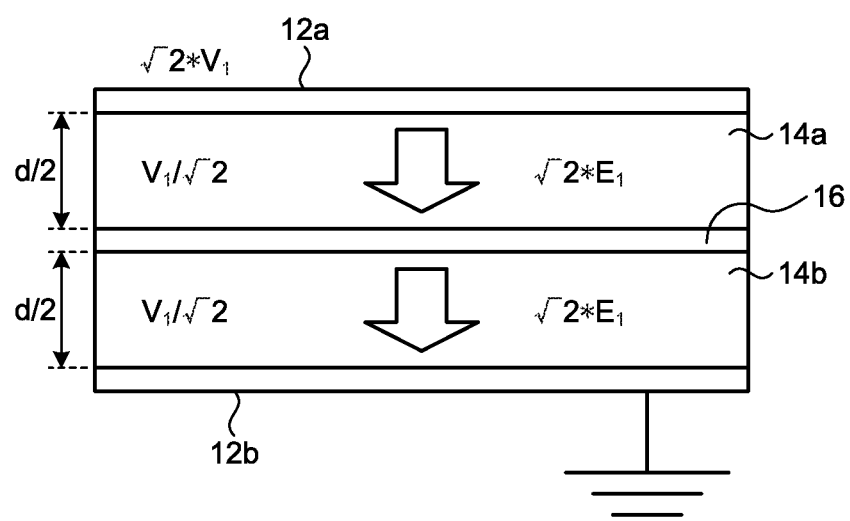
FIG. 11 is a fifth diagram for explaining an operation and an advantageous effect of the main circuit wiring member according to the first embodiment.

FIG. 10 is a fourth diagram for explaining an operation and an advantageous effect of the main circuit wiring member according to the first embodiment. FIG. 11 is a fifth diagram for explaining an operation and an advantageous effect of the main circuit wiring member according to the first embodiment. FIG. 10 is a diagram of a comparative example, and corresponds to the configuration of the general main circuit wiring member illustrated in FIG. 4.

It is assumed that a discharge starting voltage and a discharge starting electric field in the configuration in FIG. 4 that does not include the intermediate-potential layer conductor 16 are $V_1$ and $E_1(=V_1/d)$, respectively, as illustrated in FIG. 10. It is assumed that the discharge starting electric field $E_1$ is calculated by $E_1=V_1/d$.

Next, a discharge starting voltage and a discharge starting electric field in the configuration in FIG. 3 that includes the intermediate-potential layer conductor 16 are obtained. First, because the intermediate-potential layer conductor 16 is inserted at a center portion, a distance between the conductor 12a and the intermediate-potential layer conductor 16 and a distance between the intermediate-potential layer conductor 16 and the conductor 12b are equal to each other and are d/2. The above calculation is based on the assumption that the thickness of the intermediate-potential layer conductor 16 is zero.

Therefore, from the relation represented by the above expression (2), a discharge starting electric field between the conductor 12a and the intermediate-potential layer conductor 16 is $\sqrt{2}*E_1$ and a discharge starting electric field between the intermediate-potential layer conductor 16 and the conductor 12b is also $\sqrt{2}*E_1$. Further, a discharge starting voltage between the conductor 12a and the intermediate-potential layer conductor 16 is $\sqrt{2}*E_1*(d/2)=(E_1*d)*(\sqrt{2}/2)=V_1/\sqrt{2}$, and a discharge starting voltage between the intermediate-potential layer conductor 16 and the conductor 12b is also $V_1/\sqrt{2}$. Therefore, a discharge starting voltage between the conductors 12a and 12b is $(V_1/\sqrt{2})+(V_1/\sqrt{2})=\sqrt{2}*V_1$. That is, the main circuit wiring member according to the first embodiment illustrated in FIG. 3 can raise the discharge starting voltage between the conductors 12a and 12b to $\sqrt{2}$ times as compared with the general main circuit wiring member illustrated in FIG. 4.

As described above, in the main circuit wiring member according to the first embodiment, an intermediate-potential layer conductor is provided in an insulating member inserted between conductors that configure the main circuit wiring member. Therefore, it is possible to raise a breakdown voltage of the main circuit wiring member without increasing a distance between the conductors.

Figure 12:
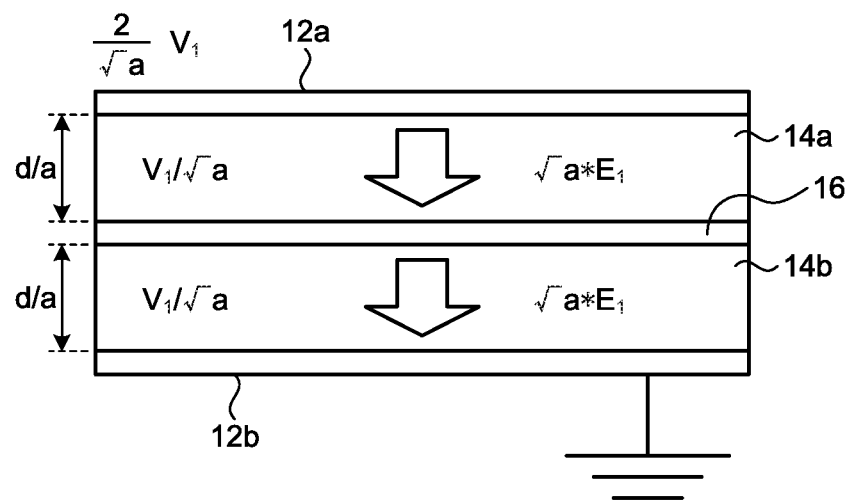
FIG. 12 is a sixth diagram for explaining an operation and an advantageous effect of the main circuit wiring member according to the first embodiment.

FIG. 12 is a sixth diagram for explaining an operation and an advantageous effect of the main circuit wiring member according to the first embodiment. In a case where a=2 in FIG. 12, the configuration thereof coincides with that in FIG. 11. Meanwhile, by selecting any real number larger than 2 as "a", an effect of downsizing appears. From a reason of ease of understanding the description, a case where a=4 is described below.

When a=4, a discharge starting voltage between the conductors 12a and 12b is $(2*V_1/\sqrt{4})=V_1$ and is coincident with that in the case in FIG. 11. Meanwhile, a distance between the conductors 12a and 12b is (d/4)+(d/4)=d/2. That is, the main circuit wiring member according to the first embodiment can shorten a distance between conductors that configure the main circuit wiring member, while maintaining the discharge starting voltage $V_1$. Therefore, it is possible to realize further downsizing while ensuring a required breakdown voltage.

In theory, downsizing can be realized by making the value of "a" larger. However, the value of "a" cannot be too large from a viewpoint of manufacturing. That is, it suffices to determine the value of "a" while considering the viewpoint of manufacturing.

Second Embodiment

Figure 13:
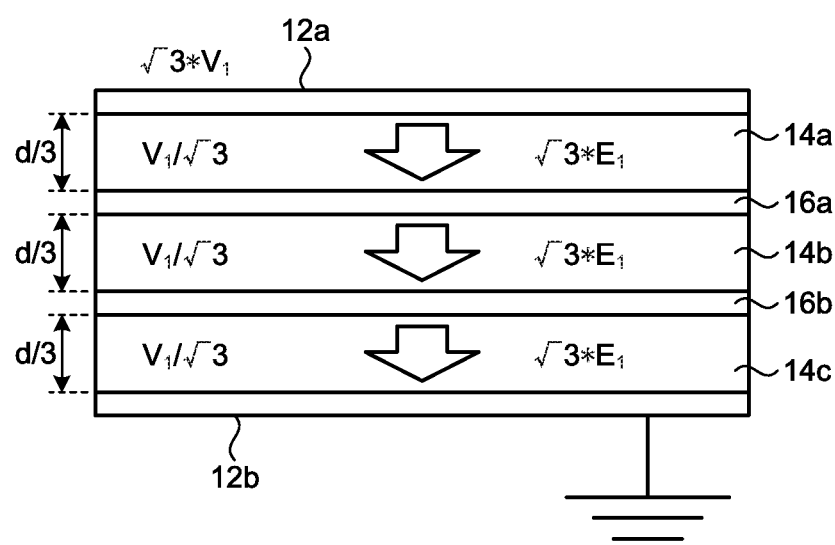
FIG. 13 is a diagram for explaining a configuration, an operation, and an advantageous effect of a main circuit wiring member according to a second embodiment.

FIG. 13 is a diagram for explaining a configuration, an operation, and an advantageous effect of a main circuit wiring member according to a second embodiment. In the first embodiment, an example in which the insulating member 14 is divided into two in an array direction of conductors has been described as an example of a feature that a discharge starting voltage can be raised by dividing the insulating member 14. In the second embodiment, an example in which the insulating member 14 is divided into three in the array direction of the conductors is described as another example of the feature that a discharge starting voltage can be raised by dividing the insulating member 14. In FIG. 13, parts common to those in FIG. 11 are denoted by like reference signs, and thus redundant explanations thereof are omitted.

In a case where the insulating member 14 is divided into three, the intermediate-potential layer conductor 16 is divided into two, that is, a first intermediate-potential layer conductor 16a and a second intermediate-potential layer conductor 16b, and the insulating member 14 is divided into three, that is, the first insulating member 14a, the second insulating member 14b, and a third insulating member 14c, as illustrated in FIG. 13. Considering that the insulating member 14 is equally divided into three, a distance between the conductor 12a and the first intermediate-potential layer conductor 16a, a distance between the first intermediate-potential layer conductor 16a and the second intermediate-potential layer conductor 16b, and a distance between the second intermediate-potential layer conductor 16b and the conductor 12b are all equal to d/3.

Therefore, from the relation represented by the above expression (2), a discharge starting electric field between the conductor 12a and the first intermediate-potential layer conductor 16a, a discharge starting electric field between the first intermediate-potential layer conductor 16a and the second intermediate-potential layer conductor 16b, and a discharge starting electric field between the second intermediate-potential layer conductor 16b and the conductor 12b are all equal to $\sqrt{3}*E_1$. Further, a discharge starting voltage between the conductor 12a and the first intermediate-potential layer conductor 16a, a discharge starting voltage between the first intermediate-potential layer conductor 16a and the second intermediate-potential layer conductor 16b, and a discharge starting voltage between the second intermediate-potential layer conductor 16b and the conductor 12b are all equal to $\sqrt{3}*E_1*(d/3)=(E_1*d)*(\sqrt{3}/3)=V_1/\sqrt{3}$. Therefore, a discharge starting voltage between the conductors 12a and 12b is $(V_1/\sqrt{3})+(V_1/\sqrt{3})+(V_1/\sqrt{3})=\sqrt{3}*V_1$. That is, the main circuit wiring member according to the second embodiment illustrated in FIG. 13 can raise the discharge starting voltage between the conductors 12a and 12b to $\sqrt{3}$ times, as compared with the general main circuit wiring member illustrated in FIG. 4. Therefore, it is possible to realize further downsizing while ensuring a required breakdown voltage. Further, the effect of raising the discharge starting voltage is larger, as compared with that in the main circuit wiring member according to the first embodiment illustrated in FIG. 3. Therefore, assuming that the discharge starting voltage is the same, the effect of downsizing is greater.

In theory, the effect of raising a breakdown voltage is greater as the number of divisions is increased. However, it is not possible to make the number of divisions too large from a viewpoint of manufacturing. That is, it suffices to determine the number of divisions while considering the viewpoint of manufacturing.

The configurations described in the above embodiments are only examples of the content of the present invention. The configurations can be combined with other well-known techniques, and a part of each configuration can be omitted or modified without departing from the scope of the present invention.

REFERENCE SIGNS LIST 10 insulating film, 12a, 12b conductor, 14 insulating member, 14a first insulating member, 14b second insulating member, 14c third insulating member, 16 intermediate-potential layer conductor, 16a first intermediate-potential layer conductor, 16b second intermediate-potential layer conductor, 101 to 106 semiconductor element module, 107, 108 connecting conductor, 110 filter capacitor, 111, 121 IGBT, 112, 122 diode.

The invention claimed is:

1. A main circuit wiring member for electrically connecting a supply source of direct-current power and a semiconductor element module to each other or semiconductor element modules to each other, comprising:
   a first conductor covered with a conductor-insulating member and configured to allow a first potential to be applied thereto;
   a second conductor covered with a conductor-insulating member and configured to allow a second potential to be applied thereto, the second potential being lower than the first potential; and
   a conductor-to-conductor insulating member having a plurality of intermediate-potential layer conductors sandwiched in one or a plurality of insulating members that are separate from said conductor-insulating members, and arranged between the first conductor and the second conductor.

2. The main circuit wiring member according to claim 1, wherein the conductor-to-conductor insulating member is divided into two in an array direction of conductors by one of the intermediate-potential layer conductors.

3. The main circuit wiring member according to claim 2, wherein a material of the intermediate-potential layer conductors is carbon.

4. The main circuit wiring member according to claim 3, wherein a material of the conductor-to-conductor insulating member is silicon-based rubber.

5. The main circuit wiring member according to claim 2, wherein a material of the conductor-to-conductor insulating member is silicon-based rubber.

6. The main circuit wiring member according to claim 1, wherein the conductor-to-conductor insulating member is divided into three in an array direction of conductors by two of the intermediate-potential layer conductors.

7. The main circuit wiring member according to claim 6, wherein a material of the intermediate-potential layer conductors is carbon.

8. The main circuit wiring member according to claim 7, wherein a material of the conductor-to-conductor insulating member is silicon-based rubber.

9. The main circuit wiring member according to claim 6, wherein a material of the conductor-to-conductor insulating member is silicon-based rubber.

10. The main circuit wiring member according to claim 1, wherein a material of the intermediate-potential layer conductors is carbon.

11. The main circuit wiring member according to claim 10, wherein a material of the conductor-to-conductor insulating member is silicon-based rubber.

12. The main circuit wiring member according to claim 1, wherein a material of the conductor-to-conductor insulating member is silicon-based rubber.

13. A power conversion device configured by using a main circuit wiring member for electrically connecting a supply source of direct-current power and a semiconductor element module to each other or semiconductor element modules to each other, wherein
   the main circuit wiring member includes
   a first conductor covered with a conductor-insulating member and configured to allow a first potential to be applied thereto,
   a second conductor covered with a conductor-insulating member and configured to allow a second potential to be applied thereto, the second potential being lower than the first potential, and
   a conductor-to-conductor insulating member having one or a plurality of intermediate-potential layer conductors sandwiched in one or a plurality of insulating members that are separate from said conductor-insulating members, and arranged between the first conductor and the second conductor, and
   the intermediate-potential layer conductors are floating potentials.

* * * * *